United States Patent [19]

Renner et al.

[11] Patent Number: 4,695,970
[45] Date of Patent: Sep. 22, 1987

[54] LINEAR PREDICTIVE CODING TECHNIQUE WITH INTERLEAVED SEQUENCE DIGITAL LATTICE FILTER

[75] Inventors: Karl H. Renner, Dallas; Alec J. Morton, Plano, both of Tex.

[73] Assignee: Texas Instruments Incorporated, Dallas, Tex.

[21] Appl. No.: 646,869

[22] Filed: Aug. 31, 1984

[51] Int. Cl.$^4$ .......................... G06F 15/31; G10L 1/00
[52] U.S. Cl. ........................................ 364/724; 381/51
[58] Field of Search .................. 364/724, 760; 381/51

[56] References Cited

U.S. PATENT DOCUMENTS

| | | | |
|---|---|---|---|
| 4,209,844 | 6/1980 | Brantingham et al. | 364/724 |
| 4,319,084 | 3/1982 | Lucchini et al. | 381/51 |
| 4,340,781 | 7/1982 | Ichikawa et al. | 364/724 |
| 4,344,148 | 8/1982 | Brantingham et al. | 364/724 |
| 4,352,162 | 9/1982 | Nyuji et al. | 364/724 |
| 4,392,018 | 7/1983 | Fette | 381/51 |
| 4,398,262 | 8/1983 | Williams | 364/724 |
| 4,443,859 | 4/1984 | Wiggins | 364/724 |
| 4,554,858 | 11/1985 | Wachi et al. | 364/724 |
| 4,597,053 | 6/1986 | Chamberlin | 364/760 |

FOREIGN PATENT DOCUMENTS 2103458  2/1983  United Kingdom .................. 381/51

*Primary Examiner*—David H. Malzahn
*Attorney, Agent, or Firm*—Leo N. Heiting; N. Rhys Merrett; Melvin Sharp

[57] ABSTRACT

An LPC digital lattice filter includes a full adder (44) which has one input thereof multiplexed with a multiplexer (46) and the other input thereof multiplexed by a multiplexer (50). Combination of the multiplication and addition steps with the full adder (44) results in the calculation of one of the digital filter equations. The result of each of these equations is either a Y-value or a B-value. The Y-values are stored in the output of a Y-register (78) and the B-values are stored in a nine stage B-stack (100) for delay thereof. The multiplexer (60) selects multiplicands from either the output of the one stage delay (86), from the B-stack (100) or the input excitation I. The multiplexer (46) selects addends from either the output of the B-stack (100), the output of the B-register (96) or from the multiplexers (60) or (66). The values are calculated in an interleaved sequence with a Y-value calculated and then a B-value calculated utilizing this generated Y-value. This generated Y-value is then used in calculating the next sequential Y-value and then discarded. However, the B-values are delayed until calculation of the next set of equations. The interleaved sequence allows use of only one set of delay stages.

18 Claims, 5 Drawing Figures

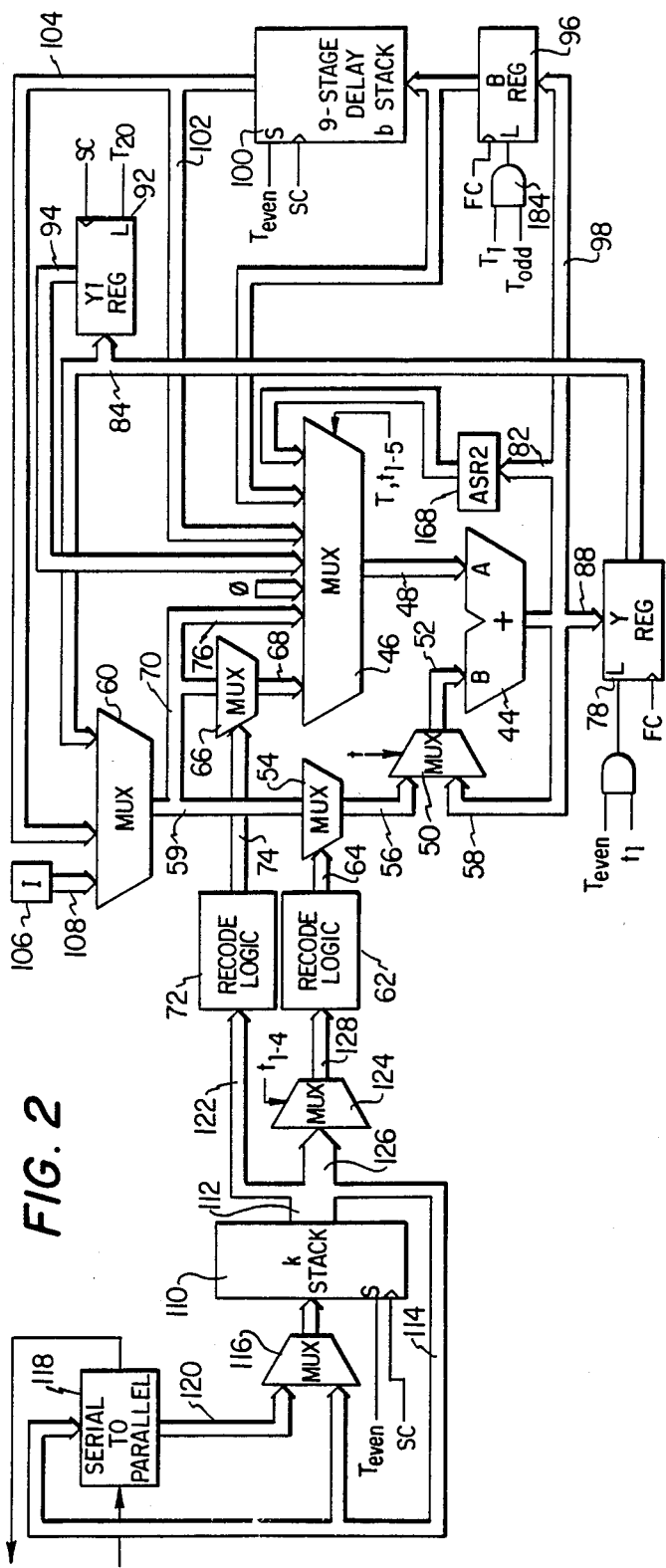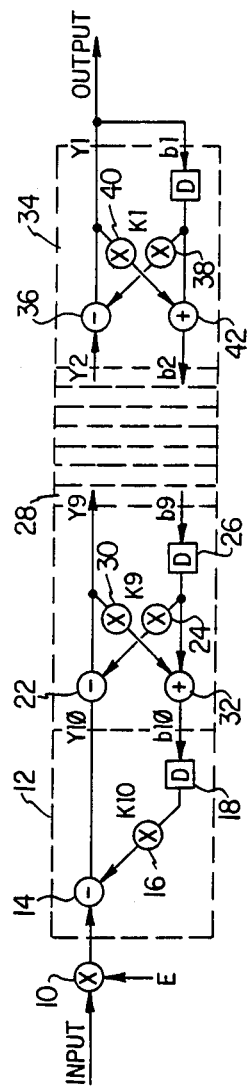
FIG. 2
FIG. 1

LINEAR PREDICTIVE CODING TECHNIQUE WITH INTERLEAVED SEQUENCE DIGITAL LATTICE FILTER

TECHNICAL FIELD OF THE INVENTION

The present invention pertains in general to speech synthesis and, more particularly, to the technique of voice compression utilizing linear predictive coding with a digital lattice filter.

CROSS REFERENCE TO RELATED APPLICATIONS

This application is related to patent application Ser. No. 646,868, patent application Ser. No. 646,381, filed Aug. 31, 1984, U.S. patent application Ser. No. 646,606, filed Aug. 31, 1984 and patent application Ser. No. 646,401, filed Aug. 31, 1984.

BACKGROUND OF THE INVENTION

Generation of complex synthesized sounds such as speech require some form of voice compression. One voice compression technique that has been heretofore utilized is linear predictive coding (LPC). LPC utilizes a digital lattice filter to model human speech from a set of prestored input parameters contained in a Read Only Memory (ROM). The LPC lattice filter typically is comprised of ten stages with each stage requiring two multiplications and two additions before passing the results backwards and forwards to its neighboring stages. The operations in the ten stages are carried out sequentially, as are the four operations within each stage. Processing of each prestored input parameter through the lattice filter results in a digital output value which is converted to an analog signal level and then amplified for output to a speaker or similar transducer.

In order to synthesize high quality speech with a digital lattice filter, it is necessary to process the prestored input parameters through the lattice filter at a repetition rate of approximately 10 KHz. To operate the lattice filter at this repetition rate, each stage must perform the digital operations therein within ten microseconds. Each of the digital addition and/or subtraction operations required for each stage utilizes a relatively straight forward process, whereas the digital multiplication operation is somewhat more complicated. Multiplication of two binary values requires iterative processing which may require up to four separate additions to yield a product, depending upon the length of the digital values multiplied. The processing of the two multiplications and two additions for each stage can therefore require the generation of up to ten seperate sums.

Heretofore, the two multiplications and two additions for each stage have been performed in a parallel fashion with five sums being simultaneously generated. In this manner, circuitry with a relatively slow response time can be utilized. However, to perform this parallel operation, five full adders are required resulting in a large parts count. This large parts count requires a significant amount of silicon surface area in order to realize the circuitry for the five full adders and the peripheral control circuitry necessary to support this number of full adders. From a cost and manufacturing standpoint, it would be desirable to utilize less circuitry to perform the same operation. Therefore, there exists a need for a circuit to process the multiplications and additions/subtractions required in each stage of the digital filter which is reliable with less circuitry without sacrificing processing time.

SUMMARY OF THE INVENTION

The present invention disclosed and claimed herein comprises a digital lattice filter for calculating Y-values and B-values for a linear predictive coding voice compression technique. The filter includes a full adder having two inputs for receiving two digital values and generating the digital sum therefor. A stack is provided for storing digital constants as multipliers in the multiplication operation. Another stack is connected to the output of the full adder for receiving and storing calculated B-values and delaying them for use in the subsequent calculations. A storage register is connected to the output of the full adder for receiving and storing calculated Y-values for use in calculation of the next sequential Y-value. The full adder is reconfigured as a multiplier for multiplication of a selected multiplier and multiplicand with the sign of the multiplier alterable. A multiplexing circuit controls the operation of the full adder to perform a multiplication operation and then sequentially add the generated product with an addend. The multiplexer is interfaced with the output of the adder and the outputs of the storage registers for selecting multiplicands and addends therefrom in accordance with the linear predictive coding technique to calculate the Y- and B-values. A timing circuit controls the multiplexer and the storage registers in addition to the stack to calculate the Y- and B-values in an interleaved sequence with Y- and B-values alternately calculated. In accordance with the interleaved sequence, the calculation of the B-value is effected using the previously calculated Y-value and a delayed B-value. Calculation of a Y-value utilizes the previously calculated Y-value in a delayed B-value. After calculation of the Y- and B-values according to the interleaved sequence, the final Y-value is placed in a register.

In accordance with another embodiment of the present invention, the multiplexer includes a first multiplexer with one input thereof connected to the output of the B-stack for selecting delayed B-values, a second input thereof connected to the output of the Y-register for selecting previously calculated Y-values, a third input thereof connected to the output of the latch to retrieve the Y-value stored therein and a fourth output thereof connected to an external source for receiving external input data. The first multiplexer selects multiplicands for the multiplication operator. A second multiplexer is included for selecting addends to be added to the generated product with a first input thereof connected to the output of the adder for receiving the sum from the previous equation, a second input thereof connected to the output of the second delay register for receiving the previously calculated Y-value and a third input thereof connected to the output of the first delay register for receiving delayed B-values. A third multiplexer is also included that is connected to the other input of the full adder for inputting the product generated on the output of the adder to the input thereof for addition with the selected addend.

BRIEF DESCRIPTION OF THE DRAWINGS

For a more complete understanding of the present invention and the advantages thereof, reference is now made to the following description taken in conjunction with the accompanyig Drawings in which:

FIG. 1 illustrates a functional block diagram of a ten stage digital filter for processing of the lattice equations;

FIG. 2 illustrates a schematic diagram of the system for multiplexing a single adder to process the lattice equations in an interleaved sequence;

DETAILED DESCRIPTION OF THE INVENTION

Figure 3:
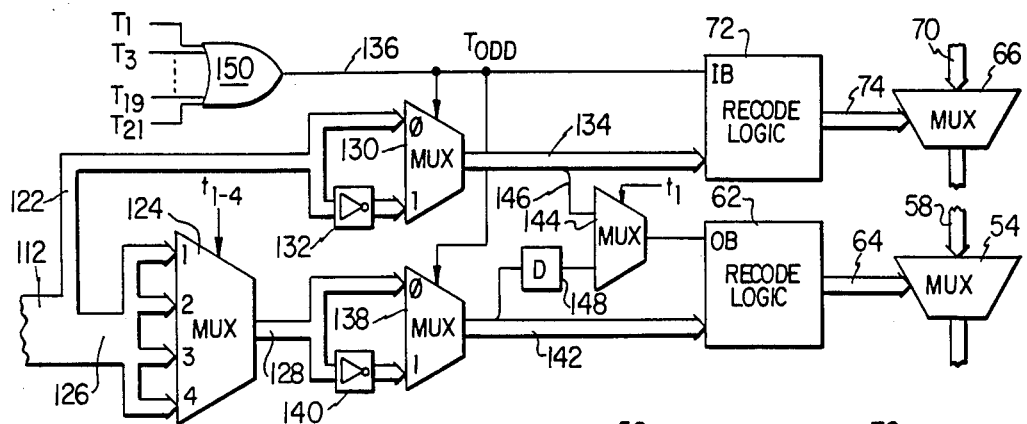
FIG. 3 illustrates a block diagram of the recode logic circuit for generating the modified booth operators.

Speech synthesis utilizing a ten stage lattice filter requires processing of a prestored speech parameter through all ten stages of the lattice filter within a predetermined duration of time. Each stage of the lattice filter has two sets of equations, one for generating the "Y" value and the other for calculating the reflection coefficient or "B" value. Both the Y- and B-values are calculated with equations consisting of one multiplication step followed by an addition or subtraction step. There are twenty separate equations required to calculate all of the Y- and B-values, each equation depending upon the results from a previous equation. These Equations are illustrated in Table 1.

TABLE 1

| | |
|---|---|
| $Y10_i = EI_i - k10b10_{i-1}$ | (1) |
| $Y9_i = Y10_i - k9b9_{i-1}$ | (2) |
| $Y8_i = Y9_i - k8b8_{i-1}$ | (3) |
| $Y7_i = Y8_i - k7b7_{i-1}$ | (4) |
| $Y6_i = Y7_i - k6b6_{i-1}$ | (5) |
| $Y5_i = Y6_i - k5b5_{i-1}$ | (6) |
| $Y4_i = Y5_i - k4b4_{i-1}$ | (7) |
| $Y3_i = Y4_i - k3b3_{i-1}$ | (8) |
| $Y2_i = Y3_i - k2b2_{i-1}$ | (9) |
| $Y1_i = Y2_i - k1b1_{i-1}$ | (10) |
| $b10_i = b9_{i-1} + k9Y9_i$ | (11) |
| $b9_i = b8_{i-1} + k8Y8_i$ | (12) |
| $b8_i = b7_{i-1} + k7Y7_i$ | (13) |
| $b7_i = b6_{i-1} + k6Y6_i$ | (14) |
| $b6_i = b5_{i-1} + k5Y5_i$ | (15) |
| $b5_i = b4_{i-1} + k4Y4_i$ | (16) |
| $b4_i = b3_{i-1} + k3Y3_i$ | (17) |
| $b3_i = b2_{i-1} + k2Y2_i$ | (18) |
| $b2_i = b1_{i-1} + k1Y1_i$ | (19) |
| $b1_i = Y1_i$ | (20) |

The input energy level or loudness is represented by "E" and this is generated either internally from prestored parameters or from an external source. A term "$I_i$" represents an input excitation value which is representative of random noise that is utilized in the generation of hissing sounds that are made by the spoken voice or periodic voiced sounds. A number of constants are provided that are prestored and labeled k1 through k10. The constants k1-k10 describe the characteristics of the equations that correspond to the shape of the mouth and the position of the tongue and teeth in order to allow generation of the various sounds corresponding to speech. The B-values are labeled b1 through b10 and are generated in a previous sample time. These previously calculated B-values are utilized to sequentially calculate the Y-values labeled Y1 through Y10. The sample time is the duration of time required to process the twenty equations and generate the value of Y1. The values generated during a given sample time are referred to as the "ith" values with the values calculated in the prior sample time referred to as the "i−1" values.

Initially, the value for $Y10_i$ is calculated according to Equation 1 utilizing the product of the input energy level E and the excitation value $I_i$, the value of the constant k10 and the previously calculated value of b10. The previously calculated value for b10 is represented by the subscript "i−1". Values for $Y9_i$ through $Y1_i$ are then calculated according to Equations 2-10 with $Y1_i$ being equal to the final result for the ith sample time. The B-values are then calculated according to Equations 11-20 by utilizing both the calculated $Y1_i$ through $Y10_i$ values and the previously calculated $b1_{i-1}$ through $b9_{i-1}$ values. These new B-values are stored for use in calculation of the Y-values during the next sequential sample time. The operation of linear predictive coding is described in more detail in "Three-chip System Synthesizes Human Speech", Richard Wiggins and Larry Brantingham, Electronics, Aug. 31, 1978, pp. 109-116.

Referring now to FIG. 1, there is illustrated a functional diagram of a 10-stage lattice filter for processing the twenty Equations in Table 1. The input energy E is input to a multiplication block 10 which also receives the excitation energy level I to generate a product EI therefor. This product EI is input to a first stage 12 of the digital filter to a subtraction block 14. The subtraction block 14 subtracts the product EI from a product generated by a multiplication block 16. The multiplication block 16 receives the delayed value of b10 which is delayed through a delay block 18 and multiplies it by the constant k10 to provide the product $k1b10_{i-1}$. The output of the subtraction block 14 is labeled Y10 which is input to a second stage 20 of the digital filter to a subtraction block 22. The subtraction block 22 receives a product from a multiplication block 24 which is the product of k9 and the delayed value of b9. This product $k9b9_{i-1}$ is delayed through a delay block 26. The output of the subtraction block 22 is the value Y9 which is input to a third stage 28 of the digital filter.

The generated Y9 value is input to a multiplication block 30 in the third stage 28 for multiplication by the constant k9 and then summed with the delayed value of b9 in a summation block 32. This summation block outputs the value of b10 which is then input to the delay block 18. The delay block 18 represents a delay for one complete sample period.

The third stage 28 performs a similar calculation as that performed in the second stage 20 except that it utilizes the constant k8. Subsequent stages calculate the values Y8 through Y2 with a final tenth stage 34 calculating the Y1 value for output from the digital filter. The tenth stage 34 receives the Y2 value at the input of a subtraction block 36 to subtract it from the product output by a multiplication block 38. The product generated by the multiplication block 38 is the product of the delayed value b1 and the constant k1. In addition, Y1 is input to a multiplication block 40 for multiplication by the constant k1, the product thereof input to an addition block 42 for addition with the delayed value of b1. The output is the value b2.

In order to process the input energy E through the ten stage lattice filter, it is necessary to process the Equations 1-20 individually and in a predetermined manner. If the equations are processed according to the order in Table 1, it is first necessary to calculate the Y-values using B-values from a preceding sample period. These B-values are stored for the duration of the previous sample period and then retrieved during processing of the Y-values. After processing of the Y-values, the B-values must then be calculated using these Y-values. Therefore, the Y-values must be stored during a given sample time for use in calculating the B-values therein. Therefore, calculation of the equations in accordance with the order of Table 1 requires sufficient memory to delay calculated B-values until a subsequent sample period for calculation of the Y-values and to store the Y-values for use in subsequent equations within a given sample period.

One technique of processing the equations is described in co-pending U.S. patent application Ser. No. 646,868, wherein a full adder is multiplexed to perform both the addition and subtraction operations and two delay data registers are utilized. One of the data registers is utilized to delay all of the Y- and B-values for use in subsequent equations and a second delay register is utilized to delay the B-values only. However, this requires a large number of shift registers for providing the delay. In accordance with the present invention, a single full adder is utilized with the operation thereof multiplexed to perform both the multiplication and addition/subtraction steps for a given equation. However, the equations are processed in an interleaved sequence such that first a Y-value is calculated and then a B-value calculated utilizing the same constant until the Y1-value has been generated. By utilizing this interleaved sequence, only one nine stage B-stack is required for delaying the B-values until the next sequential sample period. In this manner, a significant reduction in the number of delay storage registers is realized.

Referring now to FIG. 2, there is illustrated a schematic block diagram of the system in accordance with the present invention for processing Equations 1-20 of Table 1 in an interleaved sequence. A binary full adder 44 is provided having one input labeled "A" and one input labeled "B" for receiving two sixteen-bit binary numbers and providing the sum therefor on a sixteen-bit wide output. Data is supplied to the A-input of the adder 44 from a multiplexer 46 through a sixteen-bit wide data bus 48. Data is supplied to the B-input of the adder 44 from a multiplexer 50 through a sixteen-bit wide data bus 52.

The multiplexer 50 has two inputs thereto. The first input is received from a multiplexer 54 through a fifteen bit wide data bus 56 and the second input thereof is received from the output of the full adder 44 through a fifteen bit wide data bus 58. The multiplexer 54 is operable to generate partial products of a multiplicand that is received on a fifteen-bit wide data bus 59 from a multiplicand multiplexer 60. The multiplexer 54 is controlled by a recode logic circuit 62 that is connected to the multiplexer 54 through a control bus 64 to determine the operation that is performed on the multiplicand to generate the various partial products, as will be described hereinbelow.

The multiplexer 46 selects from a number of input lines thereto for input to the A-input of the full adder 44. One input of the multiplexer 46 is connected to the output of a multiplexer 66 through a fifteen-bit wide data bus 68. The input of the multiplexer 66 is connected to the fifteen-bit output of the multiplexer 60 through a data bus 70. The multiplexer 66 operates similar to the multiplexer 54 for generating the first partial product for input to the A-input of the full adder 44. In order to generate the first partial product, a recode logic circuit 72 is connected to the control input of the multiplexer 66 through a control bus 74 to determine the operation that is to be performed on the multiplicand received from the multiplexer 60 in order to generate the first partial product.

The multiplexer 46 is also connected to a zero value data word which has all the digits thereof equal to a logic "0". Another input of the multiplexer 46 is connected directly to the output of the multiplexer 60 through a data bus 76 to bypass the multiplexer 66.

The output of the full adder 44 is connected to the input of a Y-register 78 through a fifteen-bit wide data bus 88 to latch the output therefrom. The output of the Y-register 78 is connected to the input of the multiplexer 60 through a data bus 84. The data bus 82 allows the multiplexer 60 to directly input imtermediate sums generated during the multiplication cycles or the final product to the A-input of the full adder 44, whereas the data bus 84 allows the stored Y-value to be selected as a multiplicand by the multiplexer 60.

The output of the Y-register 78 is also input to a Y1-register 92 for storage of the Y1-value. The Y1-register 92 is only updated once during calculation of the Equations 1-20 in Table 1 or only once during a sample period.

The output of the full adder 44 is also connected to the input of a B-register 96 through a data bus 98. The B-register 96 functions to store the contents output by the adder 44 during the time that the adder 44 is performing other operations. The output of the B-register 96 is input to a nine stage delay B-stack 100. The B-stack 100 functions as a temporary storage medium for the results of Equations 1-20 in Table 1 relating to calculation of the B-values. The output of the B-stack 100 is input to one input of the multiplexer 46 through a data bus 102 and to one input of the multiplexer 60 through a data bus 104 for selection of delayed B-values therefrom.

The multiplicands are selected by the multiplexer 60 and these multiplicands are either the delayed B-values, the Y-values or the input parameter I. The input parameter I is stored in an external storage medium. Normally, a string of these input parameters is stored with the parameters arranged in a predetermined order and output for each sample period. Therefore, for each sample time, an input parameter I is selected and utilized to generate a Y1 value. These Y1 values are then processed through a digital to analog (D/A) converter (not shown) to reconstruct an analog output signal representing speech. This input parameter I is represented by a block 106 labeled "I" and input to the multiplexer 60 on a data bus 108. In addition, the constants k1-k10 can also be altered, as well be described hereinbelow.

The multipliers consist of the constants k1-k10 and the excitation energy E. These multipliers are stored in an eleven stage K-stack 110. The K-stack 110 is ten bits wide and has the output thereof connected to a ten-bit wide data bus 112. A feedback data bus 114 is connected between the output data bus 112 and the input of a multiplexer 116. The output of the multiplexer 116 is connected to the input of the K-stack 110. Selection of the feedback data bus 114 by the multiplexer 116 allows the data on the top of the K-stack 110 to be input back to the bottom of the K-stack 110..The data bus 114 is also connected to the input of a serial-to-parallel converter 118, the output of which is connected to the other input of the multiplexer 116 through a data bus 120. The serial-to-parallel converter 118 is interfaced with an external source to receive data therefrom and to transmit data thereto in a serial format. This allows data to be input to the K-stack 110 or extracted therefrom. In this manner, the constants k1–k10 and the value E can be altered.

The output data bus 112 has the first two bits thereof connected to the input of the recode logic circuit 72 through a two-bit wide data bus 122 and the remaining eight bits thereof connected to the input of a multiplexer 124 through an eight-bit wide data bus 126. The output of the multiplexer 124 is connected to the input of the recode logic circuit 62 through a two-bit wide data bus 128.

In processing each of the Equations 1–20 in Table 1 with the system of FIG. 2, it is necessary to perform a multiplication followed by an addition or subtraction. Subtraction is facilitated by changing the sign of the multiplier prior to the multiplication step. Since only one full adder 44 is utilized, the operation thereof must be multiplexed during a given sample time. In the preferred embodiment, the multiplication scheme utilized is a modified Booth's algorithm. In this algorithm, it is necessary to analyze the multiplier output from the K-stack 110 by segmenting the multiplier into groups of three bits with one bit overlapping in each group with an implied bit to the right of the least significant bit. Therefore, a ten-bit multiplier will result in five 3-bit groups. Each group corresponds to a partial product with a ten-bit multiplier requiring the generation of five partial products $PP_1$, $PP_2$, $PP_3$, $PP_4$ and $PP_5$. In order to generate these partial products, it is first necessary to determine the "modified Booth operator" to determine the operation that must be performed on a given multiplicand in order to generate the respective partial products. The modified Booth operators are "0", "+1", "−1", "+2" and "−2". The presence of a "−" requires the generation of the two's complement of the mulplicand and the presence of a "2" requires shifting of the multiplicand to the left by one bit with a "1" requiring no shift. Therefore, the partial products consist of the multiplicand or its two's complement shifted to the left by a maximum of one place. A modified Booth operator of "0" results in a partial product having all logic bits therein at a logic "0". The modified Booth operators are generated as shown in Table 2.

TABLE 2

| THREE-BIT GROUP | | | |
|---|---|---|---|
| A | B | C | OPERATOR |
| 0 | 0 | 0 | 0 |
| 0 | 0 | 1 | +1 |
| 0 | 1 | 0 | +1 |
| 0 | 1 | 1 | +2 |
| 1 | 0 | 0 | −2 |
| 1 | 0 | 1 | −1 |
| 1 | 1 | 0 | −1 |
| 1 | 1 | 1 | 0 |

After generation of the partial products, they are sequentially shifted by two places and added to the preceding partial products. This will require the adder to first sum $PP_1$ with $PP_2$ and then sequentially sum $PP_3$–$PP_4$ with the intermediate products, resulting in four summation operations. After the product has been generated, an additional summation is required to complete each of the Equations 1–20 in Table 1 by selecting a delayed B-value from B-stack 100 or a previously calculated Y-value for the addend.

In performing the multiplication operation, as described above, it is necessary to determine the operation that is to be performed on the multiplicand to generate the various partial products. The modified Booth operator for $PP_1$ is determined by a recode logic circuit 72 which receives the first two bits of the multiplier. Once the modified Booth operator is generated, the multiplexer 66 modifies the multiplicand to generate $PP_1$. For $PP_2$–$PP_4$, the multiplexer 124 selects the appropriate bits from the remaining eight bits of the multiplier and the recode logic circuit 62 generates a modified Booth operator in response to the selection of bits. This operator then controls the multiplexer 54 to determine the operation that is to be performed on the multiplicand for generating $PP_2$–$PP_5$.

In performing the multiplication, the multiplexer 46 selects the output of the multiplexer 66 to input $PP_1$ to the A-input of the full adder 44 and the multiplexer 50 selects the output of the multiplexer 54 to input the value of $PP_2$ to the B-input of the full adder 44. Since four summations are required for the multiplication operation, four clock cycles are generated to perform the multiplication operation. These cycles are referred to as "passes" through full adder 44. They are represented by the time periods "$t_1$", "$t_2$", "$t_3$" and "$t_4$". $PP_1$ and $PP_2$ are added during the period $t_1$. During this period, the multiplexer 124 selects the third and fourth bit of the multiplier word. During time period $t_2$, the summation of $PP_1$ and $PP_2$ is input to the A-input of full adder 44 through the multiplexer 46 from the data bus 82 during $t_2$. In addition, the fifth and sixth bits of the multiplier word selected by the multiplexer 124 and the modified Booth operator generated for $PP_3$. $PP_3$ is then input to the B-input of the full adder 44 with the multiplexer 50. This summation is then input back to the A-input of the full adder 44 for summation with $PP_4$ during $t_3$. $PP_5$ is added to this sum during $t_4$, the result being the product.

After the product has been generated, the multiplexer 50 is controlled to select the feedback data bus 58 to input the product into the B-input of the full adder 44. The appropriate addend is then selected with the multiplexer 46. This addition operation is performed during a time period $t_5$ which is equal in duration to each of the time periods $t_1$–$t_4$. Therefore, each period for processing one of the Equations 1–20 in Table 1 is divided into five separate time periods $t_1$–$t_5$. The processing time for each equation is termed a "T-time".

In the present embodiment, the outputs of the full adder 44 is, in one mode, circulated back to one of the inputs thereof. Utilization of combinational logic for addition operations would require some sort of latching circuit disposed on the adder inputs. In the preferred embodiment, however, dynamic NMOS technology is utilized which does not require an input latch to recirculate data. In dynamic NMOS devices, a four phase clock is utilized with each phase of the clock processing data through the circuit. For example, in a full adder, the first phase of the clock would cause the data to be loaded therein with the result being output from the adder on the fourth phase of the four phase clock. Therefore, the data on the output of the adder that is to be recirculated around to one input need only be there a sufficient amount of time to be loaded into the adder on the first phase of the clock. In a similar manner, loading into the delay registers is effected on the first phase of the four phase clock. This four phase clock is not illustrated and is an internal clock which is a required part of a dynamic NMOS circuit. As described above, use of conventional combinational logic for the adders would require latched inputs and/or outputs.

Referring now to FIG. 3, there is illustrated a block diagram of the logic circuitry required for generating the modified Booth operators that determine the operation performed on the multiplicands. Like numerals refer to like parts in the various figures. The two-bit data line 122 is input directly to the "0" input of a multiplexer 130 and to the "1" input thereof through an inverter circuit 132. The multiplexer 130 is controlled to select either the "0" input or the "1" input for noninverted or inverted data, respectively. This data is output to the recode logic circuit 72 on a two bit wide data bus 134. The multiplexer 130 is utilized to change the sign of the multiplier. As described above, a subtraction operation is performed by changing the sign of the multiplier, which requires the inversion of bits. Therefore, a control signal is input on a control line 136 to control the operation of the multiplexer 130. The recode logic circuit 72 analyzes the bits output by the multiplexer 130 to determine the operation that is to be performed. As described above, for $PP_1$ the first three-bit group has an implied bit. This implied bit is "0" for a positive multiplier and "1" for a negative multiplier. This implied bit is determined by the signal on an input labeled "IB" on the recode logic circuit 72 which is connected to the control line 136. When the multiplier sign is changed to negative, the implied bit is also changed.

The multiplexer 124 has four inputs labeled "1", "2", "3" and "4" for selection of the eight most significant bits of the multiplier on the data bus 126. The multiplexer 124 is controlled by the timing signals $t_1$–$t_4$. The output of the multiplexer on the bus 128 is input directly to a multiplexer 138 to the "0" input thereof and to the "1" input thereof through an inverter 140. The output of the multiplexer 138 is connected to a two bit data bus 142 for input to the recode logic circuit 62. The multiplexer 138 is controlled by the control line 136 to operate similar to the multiplexer 130 in selecting noninverted or inverted bits. In order for the recode logic circuit 62 to analyze the proper bits, the most significant bit from the previous three-bit group must be analyzed. For the first pass during period $t_1$, this constitutes bit two. This bit is extracted from the data bus 134 and input to a two input multiplexer 144 on a data line 146. The multiplexer 144 is controlled by the signal $t_1$ to select this input on the first pass. The output of the multiplexer 144 is connected to an input labeled "OB" representing the overflow bit. For the remainder of the passes $t_2$–$t_4$, the most significant bit of the previous two-bit group is selected. This is facilitated by retrieving the most significant bit from the data bus 142 and storing it in a delay register 148 for one of the time periods $t_1$–$t_5$ and then inputting it to the other input of the two input multiplexer 144. The recode logic circuit 62 then generates the appropriate modified Booth operator for input to the multiplexer 54.

The control line 136 is connected to the output of an eleven-input OR gate 150 which has the inputs thereof connected to the control signals for the various T-times. In the preferred embodiment, there are twenty-two T-times $T_1$–$T_{22}$. The T-times required to generate negative multiplicands, as will be described hereinbelow are the "odd" T-times. Therefore, the odd T-times are input to the eleven inputs of the OR gate 150 to activate the output thereof during these T-times.

Figure 4:
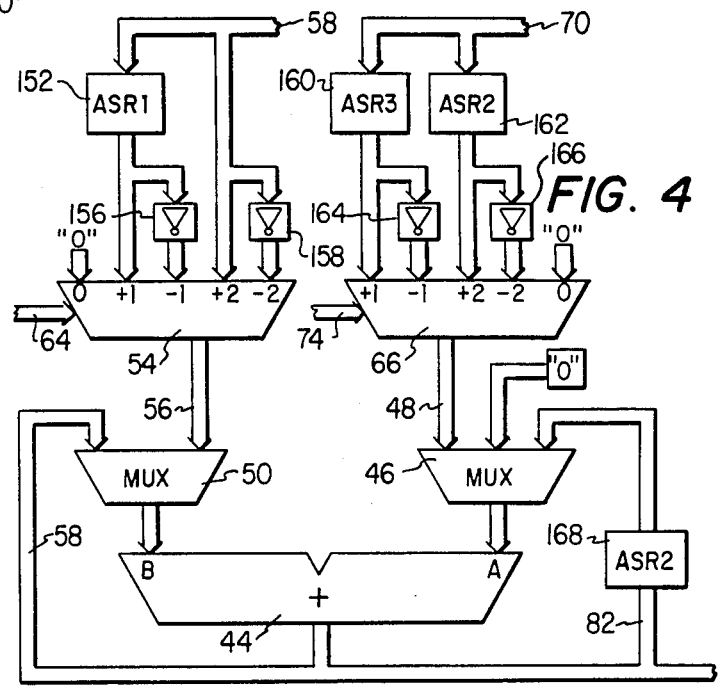
FIG. 4 illustrates a block diagram of the multiplex circuit for reconfiguring the adder as a multiplier.

Referring now to FIG. 4, there is illustrated a schematic diagram of the full adder 44 and the associated multiplexers illustrating the generation of the partial products $PP_1$–$PP_5$. Like numerals refer to like parts in the various figures. The multiplexer 54 which is controlled by the output of the recode logic circuit 62 has five inputs labeled "0", "+1", "−1", "+2" and "−2". These five inputs correspond to the modified Booth operators generated by the recode logic circuit 62. The data bus 58 is branched into two branches, one of which is input to a shifting block 152 to arithmetically shift right the bits one bit to the right wherein the sign bit is extended. The shifting block 152 is labeled "ASR1" representing an arithmetic shift register for a one bit shift. The other branch of the data bus 58 is input directly to the "+2" input of the multiplexer 54 and also to the input of an inverter bank 158 which is input to the "−2" input of the multiplexer 54. The output of the shifting block 152 is input directly to the "+1" input of the multiplexer 54 and also to the "−1" input thereof through an inverter bank 156.

The data bus 70 is split into two branches, one branch of which is input to a shifting block 160 labeled "ASR3" and the other branch of which is input to a shifting block 162 labeled "ASR2". The multiplexer 66 has five inputs labeled "0", "+1", "−1", "+2" and "−2". The output of the shifting block 160 is directly input to the "+1" input of the multiplexer 66 and also to the "−1" input thereof through an inverter bank 164. The output of the shifting block 162 is directly input to the "+2" input of the multiplexer 66 and also to the "−2" input thereof through an inverter bank 166. A digital word having all logic "0"'s is input to the "0" input.

In addition to shifting the bits for generation of the partial product $PP_1$ and $PP_2$, a shifting block 168 labeled "ASR2" is also utilized in series with the data bus 82 to shift the summation output of the full adder 44 by two bits to the right.

In order to explain the operation of the multiplication circuit of FIGS. 3 and 4, an example of digital multiplication using modified Booths algorithm is illustrated in Table 3.

TABLE 3

|  |  |  |  |
|---|---|---|---|
|  | 0.11010110011100 | = 13724 | *2**(−14) |
|  | 1.101011001 | = x(−167) | *2**(−9) |
| $PP_1$ | 00000000001101010011100 | +1 |  |
| $PP_2$ | 1111111001010011001000 | −2 |  |
| $PP_3$ | 00000110101100111000 | +2 |  |
| $PP_4$ | 000011010110011100 | +1 |  |
| $PP_5$ | 1100101001100100 | −1 |  |
|  | 11.10111010000011100111100 | = −2291908 | *2**(−23) |
| $PP_1$ | 00001101011001110 | +1 |  |
| $PP_2$ | 1001010011001000 | −2 |  |
| $\Sigma_1$ | 101000100010111 |  |  |
| $\Sigma_1$ | 111010001000010111 |  |  |
| $PP_3$ | 0110101100111000 | +2 |  |
| $\Sigma_2$ | 010100111100001 |  |  |
| $\Sigma_2$ | 000101001111100001 |  |  |
| $PP_4$ | 0011010110011100 | +1 |  |
| $\Sigma_3$ | 010010101000110 |  |  |
| $\Sigma_3$ | 00010010101000110 |  |  |
| $PP_5$ | 1100101001100100 | −1 |  |
| final product | 1.10111010000011 |  |  |

In Table 3, the multiplier is a 15-bit data word with a value of "13724*2**(-14)" and the multiplier is a fractional 10-bit data word with a value of "-167*2*(-9)*. The 10-bit multiplier requires the generation of five partial products which are generated by altering the multiplicand in accordance with the modified Booth operators that are generated. The modified Booth operator generated for $PP_1$ is "+1", "−2", for $PP_2$, "+2"

for PP$_3$, "+1" for PP$_4$ and "−1" for PP$_5$. A "+1" indicates the operation whereby the multiplicand is not altered, a "−1" requires the two's complement to be generated, a "+2" requires the multiplicand to be shifted by one place to the left and a "−2" requires shifting one place to the left and generation of the two's complement of the multiplicand. Summation of the partial products requires shifting to the left by two places for each sequential partial product. For example, PP$_2$ is shifted to the left two places with respect to PP$_1$ and PP$_3$ is shifted two places to the left with respect to PP$_2$, etc. The shifting of two places to the left is facilitated by the bit shifter 168 which essentially hardwires the data bus 82 to provide a two bit arithmetic right shift with respect to the remaining data on the B-input of the adder 44.

Multiplication of a fifteen-bit number and a ten-bit number results in a twenty-five-bit product which requires the sign bits to be extended to the left. It is important to note the presence of two sign bits in the product, one of which is a duplicate. This requires the sign bit of PP$_1$ to be extended wherein nine zeros are added to the left. In a similar manner, PP$_2$ is extended eight additional sign bits, PP$_3$ is extended six additional sign bits, PP$_4$ is extended four additional sign bits and PP$_5$ is extended two additional sign bits. When the addition is complete, nine of the least significant bits and the most significant bits are truncated from the answer such that only a fifteen-bit product results, thereby reducing the need for a twenty-five-bit output data bus. All of the bit shifting and two's complement generation is facilitated by the shifting circuits and inverter circuits such that the proper partial products can be generated and added to the shifted sum. The first shift between PP$_1$ and PP$_2$ is facilitated by the difference in bit shifting between the bit shifters 152 and the bit shifters 160 and 162. The remainder two bit shift of the adder 44 is facilitated by the bit shifter 168 on the summation output.

Figure 5:
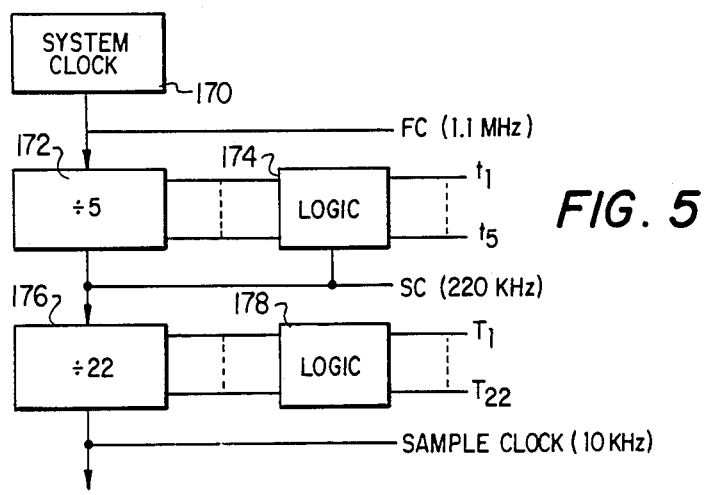
FIG. 5 illustrates a block diagram of the timing circuit for generating the fast and slow timing clocks and the T-times.

Referring now to FIG. 5, there is illustrated a block diagram of the system for generating the clock signals for timing. A system clock 170 is provided for outputting a fast clock signal (FC) of approximately 1.1 MHz. This system clock can operate at either a fundamental frequency or it can be divided down from a higher and more stable operating frequency. The output of the system clock 170 is input to a divide-by-five circuit 172 for generating a slow clock signal (SC) of 220 KHz. A logic circuit 174 is provided that is connected to both the FC and SC signals to divide each period of the slow clock into five segments $t_1$–$t_5$. Each of these time periods $t_1$–$t_5$ is equal in duration to one period of the fast clock or 0.909 microseconds. Each cycle of the slow clock is equal to 4.45 microseconds. The output of the divide-by-five circuit 172 is input to a divide-by-twenty-two circuit 176 to generate a sample clock having a frequency of 10 KHz. The sample clock determines the period of time within which a Y1-value is to be generated after processing of the Equations 1–20 in Table 1.

The divide-by-twenty-two circuit 176 has the counting outputs thereof connected to the input of a logic circuit 178 for generating the T-times $T_1$–$T_{22}$. In addition, the slow clock is also input to the logic circuit 178. Each of the T-times $T_1$–$T_{22}$ are equal in duration to one period of the slow clock frequency or 4.45 microseconds. Therefore, each period of the sample clock is divided into twenty-two equal segments, each of which has a multiplication and addition performed therein.

To more clearly illustrate the data flow through the system of FIG. 1 with the interleaved sequence of operations, the status of all the registers is illustrated in Table 4 as a function of the T-times $T_1$–$T_{22}$.

TABLE 4

| Time T | t | Mp | Mc | Adder A | Adder B | Adder Σ | b Stack Out | Y Reg | b Reg | Y1 Reg |
|---|---|---|---|---|---|---|---|---|---|---|
| 1 | 1 | " | " | PP$_1$ | PP$_2$ | EI$_i$ | " | " | " | (Y1$_{i-1}$) |
|   | 2 | " | " | Σ$_1$ | PP$_3$ | Σ$_1$ | " | " | EI$_i$ | " |
|   | 3 | −k10 | b10$_{i-1}$ | Σ$_2$ | PP$_4$ | Σ$_2$ | b10$_{i-1}$ | " | " | " |
|   | 4 | " | " | Σ$_3$ | PP$_5$ | Σ$_3$ | " | " | " | " |
|   | 5 | " | " | EI$_i$ | −k10b10$_{i-1}$ | −k10b10$_{i-1}$ | " | " | " | " |
| 2 | 1 | " | " | PP$_1$ | PP$_2$ | Y10$_i$ | " | " | " | " |
|   | 2 | " | " | Σ$_1$ | PP$_3$ | Σ$_1$ | " | Y10$_i$ | " | " |
|   | 3 | +k10 | Y10$_i$ | Σ$_2$ | PP$_4$ | Σ$_2$ | " | " | " | " |
|   | 4 | " | " | Σ$_3$ | PP$_5$ | Σ$_3$ | " | " | " | " |
|   | 5 | " | " | b10$_{i-1}$ | k10Y10$_i$ | k10Y10$_i$ | " | " | " | " |
| 3 | 1 | " | " | PP$_1$ | PP$_2$ | b11$_i$ | " | " | " | " |
|   | 2 | " | " | Σ$_1$ | PP$_3$ | Σ$_1$ | " | " | b11$_i$ | " |
|   | 3 | −k9 | b9$_{i-1}$ | Σ$_2$ | PP$_4$ | Σ$_2$ | b9$_{i-1}$ | " | " | " |
|   | 4 | " | " | Σ$_3$ | PP$_5$ | Σ$_3$ | " | " | " | " |
|   | 5 | " | " | Y10$_i$ | −k9b9$_{i-1}$ | k9b9$_{i-1}$ | " | " | " | " |
| 4 | 1 | " | " | PP$_1$ | PP$_2$ | Y9$_i$ | " | " | " | " |
|   | 2 | " | " | Σ$_1$ | PP$_3$ | Σ$_1$ | " | Y9$_i$ | " | " |
|   | 3 | +k9 | Y9$_i$ | Σ$_2$ | PP$_4$ | Σ$_2$ | " | " | " | " |
|   | 4 | " | " | Σ$_3$ | PP$_5$ | Σ$_3$ | " | " | " | " |
|   | 5 | " | " | b9$_{i-1}$ | k9Y9$_i$ | k9Y9$_i$ | " | " | " | " |
| 5 | 1 | " | " | PP$_1$ | PP$_2$ | b10$_i$ | " | " | " | " |
|   | 2 | " | " | Σ$_1$ | PP$_3$ | Σ$_1$ | " | " | b10$_i$ | " |
|   | 3 | −k8 | b8$_{i-1}$ | Σ$_2$ | PP$_4$ | Σ$_2$ | b8$_{i-1}$ | " | " | " |
|   | 4 | " | " | Σ$_3$ | PP$_5$ | Σ$_3$ | " | " | " | " |
|   | 5 | " | " | Y9$_i$ | −k8b8$_{i-1}$ | k8b8$_{i-1}$ | " | " | " | " |
| 6 | 1 | " | " | PP$_1$ | PP$_2$ | Y8$_i$ | " | " | " | " |
|   | 2 | " | " | Σ$_1$ | PP$_3$ | Σ$_1$ | " | Y8$_i$ | " | " |
|   | 3 | +k8 | Y8$_i$ | Σ$_2$ | PP$_4$ | Σ$_2$ | " | " | " | " |
|   | 4 | " | " | Σ$_3$ | PP$_5$ | Σ$_3$ | " | " | " | " |
|   | 5 | " | " | b8$_{i-1}$ | k8Y8$_i$ | k8Y8$_i$ | " | " | " | " |
| 7 | 1 | " | " | PP$_1$ | PP$_2$ | b9$_i$ | " | " | " | " |
|   | 2 | " | " | Σ$_1$ | PP$_3$ | Σ$_1$ | " | " | b9$_i$ | " |
|   | 3 | −k7 | b7$_{i-1}$ | Σ$_2$ | PP$_4$ | Σ$_2$ | b7$_{i-1}$ | " | " | " |
|   | 4 | " | " | Σ$_3$ | PP$_5$ | Σ$_3$ | " | " | " | " |
|   | 5 | " | " | Y8$_i$ | −k7b7$_{i-1}$ | " | " | " | " | " |

TABLE 4-continued

| Time | | | | Adder | | | b Stack | Y | b | Y1 |
|---|---|---|---|---|---|---|---|---|---|---|
| T | t | Mp | Mc | A | B | Σ | Out | Reg | Reg | Reg |
| 8 | 1 | " | " | $PP_1$ | $PP_2$ | $Y7_i$ | " | " | " | " |
|   | 2 | " | " | $\Sigma_1$ | $PP_3$ | $\Sigma_1$ | " | $Y7_i$ | " | " |
|   | 3 | +k7 | $Y7_i$ | $\Sigma_2$ | $PP_4$ | $\Sigma_2$ | " | " | " | " |
|   | 4 | " | " | $\Sigma_3$ | $PP_5$ | $\Sigma_3$ | " | " | " | " |
|   | 5 | " | " | $b7_{i-1}$ | $k7Y7_i$ | $K7Y7_i$ | " | " | " | " |
| 9 | 1 | " | " | $PP_1$ | $PP_2$ | $b8_i$ | " | " | " | " |
|   | 2 | " | " | $\Sigma_1$ | $PP_3$ | $\Sigma_1$ | " | " | $b8_i$ | " |
|   | 3 | −k6 | $b6_{i-1}$ | $\Sigma_2$ | $PP_4$ | $\Sigma_2$ | $b6_{i-1}$ | " | " | " |
|   | 4 | " | " | $\Sigma_3$ | $PP_5$ | $\Sigma_3$ | " | " | " | " |
|   | 5 | " | " | $Y7_i$ | $-k6b6_{i-1}$ | " | " | " | " | " |
| 10 | 1 | " | " | $PP_1$ | $PP_2$ | $b8_i$ | " | " | " | " |
|    | 2 | " | " | $\Sigma_1$ | $PP_3$ | $\Sigma_1$ | " | $Y6_i$ | " | " |
|    | 3 | +k6 | $Y6_i$ | $\Sigma_2$ | $PP_4$ | $\Sigma_2$ | " | " | " | " |
|    | 4 | " | " | $\Sigma_3$ | $PP_5$ | $\Sigma_3$ | " | " | " | " |
|    | 5 | " | " | $b6_{i-1}$ | $k6Y6_i$ | $k6Y6_i$ | " | " | " | " |
| 11 | 1 | " | " | $PP_1$ | $PP_2$ | $EI_i$ | " | " | " | $(Y1_{i-1})$ |
|    | 2 | " | " | $\Sigma_1$ | $PP_3$ | $\Sigma_1$ | " | " | $b7_i$ | " |
|    | 3 | −k5 | $b5_{i-1}$ | $\Sigma_2$ | $PP_4$ | $\Sigma_2$ | $b5_{i-1}$ | " | " | " |
|    | 4 | " | " | $\Sigma_3$ | $PP_5$ | $\Sigma_3$ | " | " | " | " |
|    | 5 | " | " | $Y6_i$ | $-k5b5_{i-1}$ | $-k5b5_{i-1}$ | " | " | " | " |
| 12 | 1 | " | " | $PP_1$ | $PP_2$ | $Y5_i$ | " | $Y5_i$ | " | " |
|    | 2 | " | " | $\Sigma_1$ | $PP_3$ | $\Sigma_1$ | " | " | " | " |
|    | 3 | +k5 | $Y5_i$ | $\Sigma_2$ | $PP_4$ | $\Sigma_2$ | " | " | " | " |
|    | 4 | " | " | $\Sigma_3$ | $PP_5$ | $\Sigma_3$ | " | " | " | " |
|    | 5 | " | " | $b5_{i-1}$ | $k5Y5_i$ | $k5Y5_i$ | " | " | " | " |
| 13 | 1 | " | " | $PP_1$ | $PP_2$ | $b6_i$ | " | " | " | " |
|    | 2 | " | " | $\Sigma_1$ | $PP_3$ | $\Sigma_1$ | " | " | $b6_i$ | " |
|    | 3 | −k4 | $b4_{i-1}$ | $\Sigma_2$ | $PP_4$ | $\Sigma_2$ | $b4_{i-1}$ | " | " | " |
|    | 4 | " | " | $\Sigma_3$ | $PP_5$ | $\Sigma_3$ | " | " | " | " |
|    | 5 | " | " | $Y5_i$ | $-k4b4_{i-1}$ | $k4b4_{i-1}$ | " | " | " | " |
| 14 | 1 | " | " | $PP_1$ | $PP_2$ | $Y4_i$ | " | " | " | " |
|    | 2 | " | " | $\Sigma_1$ | $PP_3$ | $\Sigma_1$ | " | $Y4_i$ | " | " |
|    | 3 | +k4 | $Y4_i$ | $\Sigma_2$ | $PP_4$ | $\Sigma_2$ | " | " | " | " |
|    | 4 | " | " | $\Sigma_3$ | $PP_5$ | $\Sigma_3$ | " | " | " | " |
|    | 5 | " | " | $b4_{i-1}$ | $k4Y4_i$ | $k4Y4_i$ | " | " | " | " |
| 15 | 1 | " | " | $PP_1$ | $PP_2$ | $b5_i$ | " | " | " | " |
|    | 2 | " | " | $\Sigma_1$ | $PP_3$ | $\Sigma_1$ | " | " | $b5_i$ | " |
|    | 3 | −k3 | $b3_{i-1}$ | $\Sigma_2$ | $PP_4$ | $\Sigma_2$ | $b3_{i-1}$ | " | " | " |
|    | 4 | " | " | $\Sigma_3$ | $PP_5$ | $\Sigma_3$ | " | " | " | " |
|    | 5 | " | " | $Y4_i$ | $-k3b3_{i-1}$ | $-k3b3_{i-1}$ | " | " | " | " |
| 16 | 1 | " | " | $PP_1$ | $PP_2$ | $Y3_i$ | " | " | " | " |
|    | 2 | " | " | $\Sigma_1$ | $PP_3$ | $\Sigma_1$ | " | " | " | " |
|    | 3 | +k3 | $Y3_i$ | $\Sigma_2$ | $PP_4$ | $\Sigma_2$ | " | " | " | " |
|    | 4 | " | " | $\Sigma_3$ | $PP_5$ | $\Sigma_3$ | " | " | " | " |
|    | 5 | " | " | $b3_{i-1}$ | $k3Y3_i$ | $k3Y3_i$ | " | " | " | " |
| 17 | 1 | " | " | $PP_1$ | $PP_2$ | $b4_i$ | " | " | " | " |
|    | 2 | " | " | $\Sigma_1$ | $PP_3$ | $\Sigma_1$ | " | " | $b4_i$ | " |
|    | 3 | −k2 | $b2_{i-1}$ | $\Sigma_2$ | $PP_4$ | $\Sigma_2$ | $b2_{i-1}$ | " | " | " |
|    | 4 | " | " | $\Sigma_3$ | $PP_5$ | $\Sigma_3$ | " | " | " | " |
|    | 5 | " | " | $Y3_i$ | $-k2b2_{i-1}$ | $-k2b2_{i-1}$ | " | " | " | " |
| 18 | 1 | " | " | $PP_1$ | $PP_2$ | $Y2_i$ | " | " | " | " |
|    | 2 | " | " | $\Sigma_1$ | $PP_3$ | $\Sigma_1$ | " | $Y2_i$ | " | " |
|    | 3 | +k2 | $Y2_i$ | $\Sigma_2$ | $PP_4$ | $\Sigma_2$ | " | " | " | " |
|    | 4 | " | " | $\Sigma_3$ | $PP_5$ | $\Sigma_3$ | " | " | " | " |
|    | 5 | " | " | $b2_{i+1}$ | $k2Y2_i$ | $k2Y2_i$ | " | " | " | " |
| 19 | 1 | " | " | $PP_1$ | $PP_2$ | $b3_i$ | " | " | " | " |
|    | 2 | " | " | $\Sigma_1$ | $PP_3$ | $\Sigma_1$ | " | " | $b3_i$ | " |
|    | 3 | −k1 | $b1_{i-1}$ | $\Sigma_2$ | $PP_4$ | $\Sigma_2$ | $EI_i$ | " | " | " |
|    | 4 | " | " | $\Sigma_3$ | $PP_5$ | $\Sigma_3$ | " | " | " | " |
|    | 5 | " | " | $Y2_i$ | $-k1b1_{i-1}$ | $-k1b1_{i-1}$ | " | " | " | " |
| 20 | 1 | " | " | $PP_1$ | $PP_2$ | $Y1_i$ | " | " | " | " |
|    | 2 | " | " | $\Sigma_1$ | $PP_3$ | $\Sigma_1$ | " | $Y1_i$ | " | " |
|    | 3 | +k1 | $Y1_i$ | $\Sigma_2$ | $PP_4$ | $\Sigma_2$ | " | " | " | " |
|    | 4 | " | " | $\Sigma_3$ | $PP_5$ | $\Sigma_3$ | " | " | " | " |
|    | 5 | " | " | $b1_{i-1}$ | $k1Y1_i$ | $k1Y1_i$ | " | " | " | " |
| 21 | 1 | " | " | $PP_1$ | $PP_2$ | $EI_i$ | " | " | " | $Y1_i$ |
|    | 2 | " | " | $\Sigma_1$ | $PP_3$ | $\Sigma_1$ | " | " | $b2_i$ | " |
|    | 3 | −E | $b11_i$ | $\Sigma_2$ | $PP_4$ | $\Sigma_2$ | $b11_i$ | " | " | " |
|    | 4 | " | " | $\Sigma_3$ | $PP_5$ | $\Sigma_3$ | " | " | " | " |
|    | 5 | " | " | $Y1_i$ | $-Eb11_i$ | $-Eb11_i$ | " | " | " | " |
| 22 | 1 | " | " | $PP_1$ | $PP_2$ | " | " | " | " | " |
|    | 2 | " | " | $\Sigma_1$ | $PP_3$ | $\Sigma_1$ | " | " | " | " |
|    | 3 | +E | $I_{i+1}$ | $\Sigma_2$ | $PP_4$ | $\Sigma_2$ | " | " | " | " |
|    | 4 | " | " | $\Sigma_3$ | $PP_5$ | $\Sigma_3$ | " | " | " | " |
|    | 5 | " | " | 0 | $EI_{i+1}$ | $EI_{i+1}$ | " | " | " | " |

Since, as described above, the technology utilized to realize the circuitry of FIG. 2 is dynamic NMOS, data does not appear on the output of the adder until the end of the period $t_5$ during any given T-time. Therefore, a sum always appears during $t_1$ and the next successive T-time. Since each T-time involves five different operations, this data must be latched into the latch 78 prior to $t_2$ in a given T-time.

As described above, the equations are calculated in an interleaved sequence. Equation 1 is first calculated utilizing the constant k10 to generate the value of $Y10_i$ and then $b11_i$ is calculated. Then, Equation 2 is calculated utilizing the constant k9 to generate the value of $Y9_i$. After Equation 2, Equation 11 is calculated which requires the previously calculated value of $Y9_i$ to provide the value of $b10_i$. $b10_i$ is loaded into the B-stack 100 for delay thereof and then Equation 3 calculated in the next T-time to yield the value of $Y8_i$. Following this calculation, the next lower B-value is calculated and stored in the B-stack 100 and then the next lower Y-value until the value of $Y1_i$ is calculated. For each of the Y-values calculated, one of the delayed Bvalues is selected from the top of the B-stack 100 which is a first-in first-out stack. Since Y-values are only calculated every other T-time, one delay is provided between calculation of Y-values such that the preceding Y-value is utilized again as an addend in the operation. In addition, Equations 1-10 require a subtraction operation to be performed and the sign of the multiplier is changed to reflect this subtraction operation, as described above.

During T-time $T_1$, the K-stack 110 has the contents thereof oriented such that the constant k10 is on the output thereof. The contents of the B-stack 100 are such that the value of $b10_{i-1}$ is on the top thereof and this is selected by the multiplexer 60 as the multiplicand. Once the multiplier and multiplicand have been selected, the adder 44 is configured as a multiplier and a product is generated during the periods $t_1$-$t_4$. At the end of the period $t_4$, the multiplexer 50 selects the output of the adder 44 on the data bus 58 for input to the B-input of the adder 44. This is the product $k10b10_{i-1}$. Although not shown, the value calculated during the T-time $T_{22}$ in the "i−1" sample period is the product $EI_i$ which is latched into the B-register 96. This value is selected as the input to the A-input of the adder 44 by selecting the output of the B-register 96. This is facilitated by the multiplexer 46 selecting the data on the data bus 94 for output therefrom. The addition step is performed during the period $t_5$ to generate the result for Equation 1. This result appears in the Σ column for the T-time $T_2$. The data is loaded into the Y-register 78 at the end of the period $t_1$ for each of the even T-times. In addition, the operation to be performed during $T_1$ is a subtraction, requiring the generation of an output from the OR gate 150 in FIG. 3.

During T-time $T_2$, the value of k10 remains on the output of the K-stack 110. The K-stack 110 is only incremented at the end of even T-times. To provide this clocking, $T_{EVEN}$ is fed to a shift input control for the K-stack 110 and the slow clock SC to the clock input. When $T_{EVEN}$ is active and the leading edge of SC occurs, data in the stack shifts one position; otherwise, the data does not shift. An AND gate 180 has the output thereof connected to the clock input of the K stack 110 and two inputs therefor connected to the slow clock signal and to a $T_{EVEN}$ signal. The $T_{EVEN}$ signal is output by an OR gate (not shown) which has the inputs thereof tied to all of the even T-times. This is similar to the configuration of the OR gate 150 in FIG. 3.

During $T_2$, the multiplexer 60 selects the output of the Y-register 78 on the data bus 84 for the multiplicand. This is the value of $Y10_i$ that was calculated during $T_1$. The result of the operation in $T_2$ is a value termed $b11_i$. This is an invalid value and is discarded.

During $T_3$, the K-stack 110 is incremented and the value of k9 is on the top thereof and constitutes the multiplier for the operation to be performed during this operation. The multiplexer 60 is controlled to select the output of the B stack 100 which has the value of $b9_{i-1}$ on the top thereof. The product generated during the period $t_1$-$t_4$ is $k9b9_{i-1}$ which is then input to the B-input of the adder 44. During time period $t_5$, the output $Y10_i$ of the Y-register 78 is selected. The result of the calculation in $T_3$ is $Y9_i$, which appears on the output of the adder 44 during the inital period $t_1$ in T-time $T_4$. This value of $Y9_i$ is latched into Y-register 78.

To provide the correct B-value at the top of the B-stack 100, this B-value must be clocked at the end of each even T-time. Therefore, the signal $T_{EVEN}$ is fed to the shift control input of the B-stack 100 and the slow clock SC to the clock input. In this manner, a new B-value is presented for each odd T-time and persists for two cycles of slow clock.

During T-time $T_4$, the multiplier is the k9 value and the multiplicand is the $Y9_i$ value latched into the latch 78 at the beginning of $T_4$. During time $t_5$, the product $k9Y9_i$ is input to the B-input of the adder 44 and the value of $b9_{i-1}$ selected from the top of the B-stack 100 with the multiplexer 46 through the data bus 102.

After calculation of the $b10_i$ value during T4, the value of $b10_i$ is latched into the B-register 96 in response to a clock signal thereto. The output of the B-register 96 is connected to the B-stack 100 for loading therein. Since only B-values are stored in the B-stack 100, it is only necessary to latch B-values therein. To facilitate this timing, an AND gate 184 has the output thereof connected to the control input of the B-register 96 for control thereof. One input of the AND gate 184 is connected to the $t_1$ signal and the other input thereof is connected to a signal labeled $T_{ODD}$. The $T_{ODD}$ signal is generated by inputting all of the odd T-times into an eleven-input OR gate for selection thereof. Therefore, occurrence of any of the odd T-times results in a high output from the OR gate. In operation, the AND gate 184 generates a load control signal on the output thereof whenever the T-time is an odd T-time and during the first pass $t_1$.

For example, $b10_i$ was generated at the beginning of $T_5$ and is output from the adder 44 during the initial portion of the T-time during $t_1$. At the end of the period $t_1$, the summation result for the first two partial products appears. Therefore, it is necessary to load the value output by the adder 44 only during the period $t_1$. This value remains in the B-register 96 through the odd T-time and to the end of the next even T-time. For example, the $b10_i$ value generated at the end of $T_4$ is latched into the B-register 96 during the period $t_1$ in T-time $T_5$. This value remains in the B-register 96 until the end of $T_6$, at which time it is clocked into the B-stack 100. Since the B-stack 100 is nine stages long, the value of $b10_i$ will not appear on the top of the stack until nine clock cycles later. Since two T-times have to occur for each clock cycle, the value of $b10_i$ will be delayed by eighteen cycles of the slow clock from the time that it was generated at the end of $T_4$, which will place it on the output of the B-stack 100 during $t_1$ of the next sample period. At this time it will have a subscript of "i−1". This is illustrated in the B-stack column of Table 3 and labeled $b10_{i-1}$.

The processing of the data continues with the K-stack 110 shifted at the end of each even T-time with the next sequential delayed B-value pulled off of the B-stack 100 as the multiplicand in an odd T-time and the previous calculated Y-value retrieved from the output of the latch 78 for the even T-time as the multiplicand. The addition operation in the odd T-time retrieves the Y-value on the output of the Y-register 78 for input to the A-input of the adder 44 during an odd T-time and retrieves the delayed B-value on the top of the B-stack 100 for input to the A-input of the adder 44 during the even T-times. Therefore, Y-values are calculated during odd T-times and B-values are calculated during even T-times. The Y- and B-values are sequentially calculated until the value of $Y1_i$ is calculated in $T_{19}$. This value of $Y_1$ appears on the output of the adder 44 during the period $t_1$ in T-time $T_{20}$.

The value of $Y1_i$ is then clocked through the one stage delay and appears on the output thereof at the beginning of $T_{21}$. The Y1 register 92 is controlled by $T_{21}$ such that the $Y_1$ value is loaded into the Y1-register 92 at the beginning of the $T_{21}$ period. After the value of $Y1_i$ has been calculated, it is then necessary to calculate the value of $b2_i$ during $T_{20}$. In order to calculate $b2_i$ according to Equation 19, it is necessary to have a value of $b1_{i-1}$. Since $b1_{i-1}$ *is equal to* $Y1_{i-1}$, the output of the Y1-register 92 is selected by multiplexer 46 to the A-input of the adder 44 during $t_5$ of $T_{20}$. During the previous T-time $T_{19}$, the value of $Y1_{i-1}$ was also selected by the multiplexer 60 as the multiplicand in calculation of the $Y1_i$ value.

During the next T-time $T_{21}$, the value of $b11_i$ is extracted from the top of the B-stack 100 which, as described above, is unused data and the result of the calculation of $T_{21}$ is discarded. During $T_{22}$, however, the initial product of $EI_{i+1}$ is generated by selecting the value of $I_{i+1}$ as a multiplicand with the mutliplexer 60 then placing the value of E at the top of the K-stack 110 as the multiplier. Since the product of $EI_{i+1}$ is all that is necessary, the addend for the addition operation is selected by the multiplexer 46 as being the "0" value. This results in the product $EI_i$ appearing during $T_1$ in the next sample period.

In summary, there has been provided a system for processing the equations for an LPC digital lattice filter. A single adder is utilized which has the operation thereof multiplexed to perform a multiplication operation followed by an addition operation to generate the results of each of the equations. By utilizing an interleaved sequence, a Y-value can be generated and then a corresponding B-value using that generated Y-value. This previously generated value is then used in the next sequential equation to generate the next sequential Y-value. Therefore, the Y-value is generated and delayed by a maximum of one stage before being used again. After this second use, it is not required again. The B-values, however, must be delayed for one sample period for utilization in calculation of the next sequential set of Y-values. This requires a delay stack having nine stages. In utilizing the sequenced operation, only one first-in first-out delay register is required in addition to only one multiplexed adder. This results in signficantly reduced circuitry requirements.

Although the preferred embodiment has been disclosed in detail, it should be understood that various changes, substitutions and alterations can be made therein without departing from the spirit and scope of the invention as defined by the appending claims.

What is claimed is:

1. A digital lattice filter having n operational stages for calculating Y-values and B-values for a linear predictive coding voice compression technique in accordinace with the equations:

$$Y(n)_i = Y(n+1)_i - k(n)_{i-1}$$

$$b(N+1)_i = b(n)_{i-1} + k(n)Y(n)_i$$

where:
n is the operational stage in which the equation is processed,
i is the sample time required to process the equations through the n operational stages, and
k is a multiplier constant, there being n multiplier constants, the digital lattice filter comprising:
full adder means having two inputs and an output for receiving two digital values and generating the digital sum therefore on the output;
stack means for storing the k multiplier constants;
first delay storage means connected to the output of said full adder means for receiving and storing calculated B-values and delaying them for use in the i+1 sample time;
second delay storage means connected to the output of said full adder means for receiving and storing the calculated Y-values as addends for use in calculation of the next sequential Y-value;
multiplication means for interfacing with said adder means for receiving a selected multiplier and multiplicand to generate and sum partial products with said adder means in accordance with a predetermined multiplication algorithm to generate a product, said multiplication means selectively changing the sign of the selected multiplier to generate a negative product for calculation of Y values;
multiplexing means for controlling the operation of said adder means and said multiplication means to perform a multiplication operation and then add the generated product with an addend;
said multiplexing means interfaced with the output of said stack means for selecting a multiplier constant and said first and second delay means for selecting multiplicands and addends therefrom in accordance with the linear predictive coding technique to sequentially calculate the Y- and B-values;
timing means for controlling said multiplexing means, said first and second delay means and said stack means to calculate the Y- and B-values in an interleaved sequence with Y- and B-values alternately calculated, the calculation of a B-value using the previously calculated Y-value as a multiplicand and a delayed B-value output from said first storage means as an addend, and calculation of a Y-value utilizing the previously calculated Y-value stored in said second storage means as an addend and a delayed B-value output from said first storage means as a multiplicand; and
register means for storing the final Y-value calcualted in accordance with the linear predictive coding technique for n equal to 1.

2. The digital lattice filter of claim 1 wherein said full adder means comprises a full adder.

3. The digital lattice filter of claim 1, wherein said predetermined multiplication algorithm is a modified Booth's algorithm and said multiplication means comprises:

means for generating partial products for the selected multiplier and multiplicand;

a first multiplexer connected to one input of said adder means and having one input thereof for receiving the a select one of the partial products generated by said partial product means and another input thereof connected to the output of said adder means; and control means for controlling the operation of said partial product means and said multiplexer to add the first and second partial products to provide a partial product sum and then sequentially add the remaining partial products to the partial product sum to provide the generated product.

4. The digital lattice filter of claim 1 wherein said stack means comprises a first-in first-out circulating stack, said stack controlled by said timing means to circulate the k multiplier constants contained therein.

5. The digital lattice filter of claim 1 and further comprising means for altering the value of the k multiplier constants stored in said stack means.

6. The apparatus of claim 1 wherein said first delay storage means comprises an n-1 stage first-in first-out data stack.

7. The digital lattice filter of claim 1 wherein said second delay means comprises a one stage data register.

8. The apparatus of claim 1 wherein said multiplexing means comprises:

a first multiplexer having one input thereof connected to the output of said first delay storage means for selecting delayed B-values, a second input thereof connected to the output of said second delay storage means for selecting previously calculated Y-values, a third input thereof connected to an external source for receiving external input data, said first multiplexer selecting multiplicands for input to one input of said adder means;

a second multiplexer operable in the nth stage of operation for selecting addends to be selectively input to the one input of said adder means to be added to the generated product and having a first input, a second input thereof selectively connectable to the output of said second delay means for receiving the previously calculated Y-value for the n+1 stage, a second input thereof selectively connectable to the output of said first delay means for receiving delayed B-values; and a third multiplexer connected to the other input of said adder means for inputting the product generated by said multiplication means on the output of said adder means to the input thereof.

9. The digital lattice filter of claim 1 wherein said timing means comprises:

a first clock having a period equal to the duration required to calculate the Y- and B-values for all n stages to provide the final Y-value for n equal to 1;

a second clock synchronous with said first clock for generating a plurality of T-times, each T-time equal to the duration of time required to calculate each of the Y- and B-values and controlling said multiplexing means, said first and second delay means and said stack means to first calculate a Y-value during one of said T-times for the given nth stage and then calculate a B-value during the next successive one of said T-times for the given nth stage; and a third clock synchronous with said first clock for controlling the operation of said multiplication means and said multiplexing means to determine the amount of time required for generation of a product by said multiplication means and subsequent addition of the addend with the generated product by said multiplexing means.

10. A digital lattice filter having n stages for calculating Y-values and B-values in a linear predictive coding voice compression technique in accordance with the equations:

$$Y(n)_i = Y(n+1)_i - k(n)_{i-1}$$

$$b(n+1)_i = b(n)_{i-1} + k(n)Y(n)_i$$

where:

n is the equation being processed and the stage in which it is processed, i is the sample time requied to process the equations through n stages, and k is a multiplier constant, there being n multiplier constants, the digital lattice filter comprising:

a full adder having two inputs for receiving digital values and an output for providing the sum thereof;

a rotary data register for storing the k multiplier constants in a predetermined order;

a delay stack having an input connected to the output of said full adder for selectively receiving and storing the calculated B-values in the i sample time and outputting the stored B-values on an output after a predetermined amount of delay in the i+1 sample time;

a delay register having an input connected to the output of said full adder for selectively receiving and temporarily storing Y-values during calculation of a B-value;

a multiplicand multiplexer for selecting multiplicands for a multiplication operation, said multiplicand multiplexer having one input thereof connected to the output of said delay stack for receiving delayed B-values and a second input thereof connected to the output of said delay register for receiving the delayed Y-values;

partial product means for selecting the k multiplier constant at the top of said rotary data register and the multiplicand output by said multiplicand multiplexer and generating partial products therefor in accordance with a predetermined iterative multiplication algorithm, said partial product means selectively changing the sign of the selected multiplier constant to provide the inverse of k(n) for calculation of Y-values;

a feedback multiplexer connected to one input of said adder for selecting the output of said adder for input to one input thereof or the output of said partial product means to said one input;

an addend multiplexer having an output connected to the other input of said adder and having an input for receiving the first partial product output by said partial product means, an input for receiving the delayed B-values output by said delay stack, an input for receiving the summed partial products on the output of said adder and an input for receiving the output of said delay register, each of the inputs of said addend multiplexer selectable for connection to the output thereof;

said addend multiplexer and said feedback multiplexer operating to first add the first and second partial products output by said partial product means and then add the product thereof to the third and subsequent partial products to generate a final product;

said feedback multiplexer operable to feed back the generated product of the multiplication operation to said one input of said adder and said addend multiplexer operable to select an addend to add to said generated product to provide the result of the Y- or B-value calculated in a given one of the n stages;

timing means for controlling the operation of the lattice filter to alternately calculate the Y-values and B-values for each of the n stages in an interleaved sequence such that calculation of a Y-value for a given one of the n stages utilizes a Y-value calculated in the previous n+1 stage and a delayed B-value is followed by calculation of a B-value for the given n stage utilizing the same delayed B-value and the previously calculated Y-value from the given n stage, the calculation of the B-value for the given n stage followed by calculation of the next sequential Y-value for the next one of the n stages utilizing the previously calculated Y-value wherein only the B-values are calculated and delayed for calculation of another set of Y- and B-values; and a latch for storing the Y-value for the n equal to 1 stage therein.

11. The digital lattice filter of claim 10 wherein said rotary data register comprises a first-in first-out register having the output connected to the input thereof to provide for circulating data.

12. The digital lattice filter of claim 10 and further comprising means for altering the data in said rotary data register.

13. The digital lattice filter of claim 10 wherein said delay register comprises a one stage register for delaying the stored Y-value for the duration of time required to calculate the Y- and B-value for a given one of the n stages.

14. The digital lattice filter of claim 10 wherein the predetermined algorithm utilized to generate said partial products is a modified Booth's algorithm.

15. The digital lattice filter of claim 10 wherein said timing means comprises:

a first clock for determining the duration of time to calculate all of the Y- and B-values for all of the n stages to generate the final Y-value for the n equal to 1 stage and for controlling storage thereof in said latch;

a second clock for dividing said first clock period into a plurality of time periods, each time period corresponding to the duration of time for calculation of either a Y- or B-value, said second clock controlling the calculation of the Y- and B-values and the sequence thereof; and a third clock for dividing each of the time periods in said second clock into segments, each segment determining the amount of time required to add the two values on the input of said adder, said third clock controlling said adder to provide a sum.

16. A method of calculating Y- and B-values in a digital lattice filter operated in accordance with a linear predictive coading voice compression technique with Y- and B-values calculated with the equations:

$$Y(n)_i = Y(n+1)_i - k(n)b(n)_{i-1}$$

$$b(n+1)_i = b(n)_{i-1} + k(n)Y(n)_i$$

where:

n is the operational stage in which the equation is processed, i is the sample time required to process the equations through the n oprational stages, and k is the multiplier constant, there being n multiplier constants, comprising;

storing in a rotary data register the k(n) multiplier constants in a predetermined order;

providing B-delay storage to receive the B-values for storage and delay of the stored B-values for output in the i+1 sample time as the $b(n)_{i-1}$ values;

providing Y-delay storage to receive Y-values $Y(n)_i$ values for storage and delay of the stored Y-values for one operational stage for output therefrom as the $Y(n+1)_i$ value;

retrieving a k(n) value as a multiplier from the rotary data register and a delayed B-value $b(n)_{i-1}$ from the B-delay storage as a multiplicand, and $Y(n+1)_i$ addend for a given n operational stage of operation to generate a product followed by a subtraction operation of the product from the addend to calculate $Y(n)_i$;

storing the $Y(n)_i$ value in the Y-delay storage;

retrieving a k(n) value as a multiplier from the rotary data register and the previously calculated Y-value $Y(n)_i$ for the given n operational stage and multiplying the multiplier k(n) by the previously generated Y-value $Y(n)_i$ to generate a product and retrieving the B-value $b(n)_{i-1}$ and adding it to the generated product to provide the B-value $b(n+1)_i$;

inputting the $b(n+1)_i$ value in the B-delay storage for delay to the i+1 sample time;

decrementing n to the next n value and calculating the next $Y(n)_i$ and the $b(n+1)_i$ values until n is equal to one; and storing the $Y(n)_i$ value for n equal to one in an output register.

17. The method claim of claim 16 wherein the multiplication operation followed by the subtraction or addition operation in calculating the $Y(n)_i$ and $b(n+1)_i$ values comprises:

providing a full adder having two inputs for reciving two digital values and an output for outputting the sum of the two input values;

generating partial products of the multiplier and multiplicand and summing the partial products with the full adder to generate the products;

generating the negative product for the $Y(n)_i$ calculation; and inputting the generated product and the addend to the inputs of the full adder to generate the $Y(n)_i$ or $b(n+1)_i$ value.

18. The method of claim 16 wherein the steps of retrieving the k(n) value from the rotary data register, the $b(n)_{i-1}$ value from the B-delay register, and the $Y(n)_i$ value from the Y-delay register and the step of storing the $Y(n)_i$ value for n equal to one in the output register comprises:

generating a first clock having a direction of time equal to the length of the i sample time for controlling the time when the $Y(n)_i$ value for n equal to one is stored;

generating a second clock synchronous with the first clock, the second clock dividing the period of the first clock into an equal number of time periods, each time period equal to the time required to generate either the $Y(n)_i$ value or the $b(n+1)_i$ value, the second clock operating in decrement the value of n for every other cycle of the second clock signal, the B-delay storage, Y-delay storage and rotary data stack synchronised with the second clock such that the $b(n)_i+1$ value of the output from the B-delay storage for every other cycle of the second clock and the $Y(n+1)_i$ value is output from the Y-delay storage for every other alternate cycle of the second clock signal.

* * * * *